(12) United States Patent
Sawada et al.

(10) Patent No.: US 7,759,711 B2
(45) Date of Patent: Jul. 20, 2010

(54) SEMICONDUCTOR DEVICE WITH SUBSTRATE HAVING INCREASED RESISTANCE DUE TO LATTICE DEFECT AND METHOD FOR FABRICATING THE SAME

(75) Inventors: Kazuyuki Sawada, Toyama (JP); Yuji Harada, Hyogo (JP); Masahiko Niwayama, Kyoto (JP); Saichirou Kaneko, Kyoto (JP); Yoshimi Shimizu, Osaka (JP)

(73) Assignee: Panasonic Corporation, Osaka (JP)

( * ) Notice: Subject to any disclaimer, the term of this patent is extended or adjusted under 35 U.S.C. 154(b) by 94 days.

(21) Appl. No.: 12/255,933

(22) Filed: Oct. 22, 2008

(65) Prior Publication Data

US 2009/0206366 A1 Aug. 20, 2009

(30) Foreign Application Priority Data

Feb. 15, 2008 (JP) .............................. 2008-034312

(51) Int. Cl.
*H01L 29/32* (2006.01)
*H01L 21/26* (2006.01)

(52) U.S. Cl. ................ 257/273; 257/378; 257/E27.027; 257/E29.107; 257/E21.328; 438/308; 438/378; 438/795

(58) Field of Classification Search ................ 257/260, 257/262, 273, 378, 493, 566, E25.029, E27.03, 257/E27.032, E29.027, E29.107, E29.175, 257/E21.328; 438/308, 378, 795
See application file for complete search history.

(56) References Cited

U.S. PATENT DOCUMENTS 5,672,906 A * 9/1997 Saito et al. .................. 257/617

| | | | |
|---|---|---|---|
| 6,677,622 B2 | 1/2004 | Suzuki et al. | |
| 6,759,301 B2 | 7/2004 | Takei et al. | |
| 2005/0258493 A1 | 11/2005 | Aono et al. | |
| 2007/0090482 A1* | 4/2007 | Kaneko et al. | ............. 257/492 |

FOREIGN PATENT DOCUMENTS

JP 2007109785 A * 4/2007

OTHER PUBLICATIONS

Terashima, T., et al., "Configuration of JI-LIGBT for Over 100 kHz Switching", Proceedings of the 19th International Symposium on Power Semiconductor Devices & ICs, May 27-30, 2007, pp. 225-228, IEEE, Jeju Korea.

* cited by examiner

*Primary Examiner*—Minh-Loan T Tran
*Assistant Examiner*—W. Wendy Kuo
(74) *Attorney, Agent, or Firm*—McDermott Will & Emery LLP

(57) ABSTRACT

Disclosed is a semiconductor device including: an N-type RESURF region formed in a P-type semiconductor substrate; a P-type base region formed in an upper portion of the semiconductor substrate so as to be adjacent to the RESURF region; an N-type emitter/source region formed in the base region so as to be apart from the RESURF region; a P-type base connection region formed in the base region so as to be adjacent to the emitter/source region; a gate insulating film and a gate electrode overlying the emitter/source region, the base region, and the RESURF region; and a P-type collector region formed in the RESURF region so as to be apart from the base region. Lattice defect is generated in the semiconductor substrate such that a resistance value of the semiconductor substrate is twice or more the resistance value of the semiconductor substrate that depends on the concentration of an impurity implanted in the semiconductor substrate.

12 Claims, 12 Drawing Sheets

SEMICONDUCTOR DEVICE WITH SUBSTRATE HAVING INCREASED RESISTANCE DUE TO LATTICE DEFECT AND METHOD FOR FABRICATING THE SAME

CROSS-REFERENCE TO RELATED APPLICATIONS

This application claims priority under 35 U.S.C. §119 on Patent Application No. 2008-34312 filed in Japan on Feb. 15, 2008. The entire disclosures in the claims, specification and drawings of this Japanese patent application are hereby incorporated by reference.

BACKGROUND OF THE INVENTION

The present invention relates to a semiconductor device and a method for fabricating the same, especially to a semiconductor device which is used as a switching power supply device and serves as a high-voltage semiconductor switching element for repeatedly opening and closing flow of a principal current and a method for fabricating the same.

Switching elements, such as high-voltage MOS (metal-oxide-semiconductor) transistors for switching ON/OFF of a current, are widely used in power semiconductor devices for power conversion equipment and power control equipment. However, insulator gate bipolar transistors (hereinafter abbreviated as "IGBT") having a function of conductivity modulation are more suitable for the high-power use because of the necessity of a small voltage drop at the time of turn-on in order to reduce as much power loss as possible.

The structure and operation of a lateral IGBT is hereinafter described as an example of prior art (see, for example, Proceedings of the 19th International Symposium on Power Semiconductor Devices & ICs, pp. 225-228, May 2007).

FIG. 17 is an example of prior art, showing a cross sectional structure of a lateral IGBT formed on a semiconductor substrate having a thickness of 170 μm.

As shown in FIG. 17, an N-type RESURF region 202 exists in an upper portion of a semiconductor substrate 201 of P-type silicon (Si), and a P-type base region 204 is provided adjacent to the N-type RESURF region 202. An N-type emitter/source region 205 having an impurity concentration higher than that of the RESURF region 202 is provided in an inner upper portion of the base region 204. A P-type contact region 208 having an impurity concentration higher than that of the base region 204 is also provided in the inner portion of the base region 204 so as to be adjacent to the emitter/source region 205. A polysilicon gate electrode 207 lies above the emitter/source region 205, the base region 204, and part of the RESURF region 202. A gate insulating film 206 is interposed between the gate electrode 207 and said regions 205, 204 and 202. A P-type collector region 211 is provided in an upper portion of the RESURF region 202 so as to be apart from the base region 204.

In the conventional lateral IGBT, the thickness of the semiconductor substrate 201 is reduced to 170 μm to lower resistance of the semiconductor substrate 201 in the thickness direction, thereby increasing the number of carriers flowing to a back side electrode at the time of turn-off. By doing so, reduction (speed-up) of turn-off time is attempted without having lattice defect which controls lifetime of the carriers in the semiconductor substrate 201.

However, in the above conventional semiconductor device, the reduction in thickness of the semiconductor substrate 201 greatly decreases the strength of the semiconductor substrate 201, and therefore, a crack may occur in the semiconductor substrate 201 during the step of, for example, forming a metal film, which serves as a back side electrode, on a surface of the semiconductor substrate 201 opposite to the gate electrode 207. To avoid this, a special transfer system or technique is necessary. Besides, punch-through voltage between the RESURF region 202 and the back side electrode is decided by the thickness of the semiconductor substrate 201, and therefore, reduction in thickness of the semiconductor substrate 201 causes a decrease in possible drain breakdown voltage. In addition, reduction in thickness of the semiconductor substrate 201 leads to an increase in resistance of the semiconductor substrate in a lateral direction. As a result, on-resistance of the IGBT increases.

SUMMARY OF THE INVENTION

An object of the present invention is to solve the above problems and provide a power semiconductor device of low on-resistance and high breakdown voltage in which switching speed is enhanced while sufficient substrate strength is ensured.

To achieve the above object, a semiconductor device of the present invention has a structure in which the semiconductor substrate has lattice defect such that a resistance value of the semiconductor substrate is twice or more the initial resistance value of the semiconductor substrate.

Specifically, a semiconductor device of the present invention includes: a semiconductor substrate of a first conductivity type; a RESURF region of a second conductivity type formed in an upper portion of the semiconductor substrate; a base region of the first conductivity type formed in an upper portion of the semiconductor substrate so as to be adjacent to the RESURF region; an emitter/source region of the second conductivity type formed in the base region so as to be apart from the RESURF region; a base connection region of the first conductivity type formed in the base region so as to be adjacent to the emitter/source region; a gate insulating film overlying the emitter/source region, the base region, and the RESURF region; a gate electrode formed on the gate insulating film; a collector region of the first conductivity type formed in the RESURF region so as to be apart from the base region; and an emitter/source electrode formed on the semiconductor substrate and electrically connected to the base connection region and the emitter/source region, wherein the semiconductor substrate has lattice defect such that a resistance value of the semiconductor substrate is twice or more a resistance value of the semiconductor substrate that depends on a concentration of an impurity implanted in the semiconductor substrate.

According to the semiconductor device of the present invention, carriers are trapped in the lattice defect formed in the semiconductor substrate of a first conductivity type when the semiconductor device is switched from ON state to OFF state. The current fall speed is therefore increased.

It is preferable that the semiconductor device of the present invention further includes: a drain region of the second conductivity type formed in the RESURF region so as to be apart from the base region; and a collector/drain electrode electrically connected to the collector region and the drain region.

In this structure, the semiconductor device of the present invention can function as MOSFET (metal-oxide-semiconductor field effect transistor) if the collector current flowing in the semiconductor device is relatively small, and as IGBT if the collector current is large. In other words, a semiconductor device of the present invention can function as two different types of transistors, MOSFET and IGBT. MOSFET has characteristics that the ON/OFF speed is fast, and IGBT has characteristics that the fall speed is slower than that of MOSFET. However, according to the present invention having a drain region, the current fall speed is increased by carriers trapped in the lattice defect formed in the semiconductor substrate when the IGBT is switched to OFF state. Thus, a semiconductor device capable of reducing switching loss under all states of current, from low current to high current, is achieved.

In the semiconductor device of the present invention, it is preferable that the semiconductor substrate has a thickness of 200 μm or more.

In this structure, the total amount of lattice defect generated in the semiconductor substrate is great, and therefore, an increased amount of carriers can be trapped. As a result, the fall speed when the IGBT is switched to OFF state is increased. In addition, the first conductivity type semiconductor substrate having a great thickness has the effect of suppressing punch through between the second conductivity type RESURF region and the back side electrode. It is therefore possible to achieve a semiconductor device with higher collector breakdown voltage. Moreover, since the resistance of the semiconductor substrate in a lateral direction is reduced, on-resistance is also reduced. Further, the semiconductor substrate is thick enough to have sufficient strength while being treated, and thus, the probability of crack in the semiconductor substrate is greatly reduced.

In the semiconductor device of the present invention, it is preferable that the RESURF region and the base region have lattice defect in the same condition as the semiconductor substrate.

In this structure, carriers are also trapped in the lattice defect of the RESURF region and the base region. As a result, the current fall speed is further increased.

In the semiconductor device of the present invention, it is preferable that the thickness of the semiconductor substrate including the RESURF region and the base region is 205 μm or more.

This structure ensures that the thickness of the semiconductor substrate alone, excluding the RESURF region, is 200 μm or more and realizes high breakdown voltage.

In the semiconductor device of the present invention, it is preferable that the collector region has an impurity concentration lower than that of the base connection region.

In general, it is preferable that a base region has low connection resistance in order to prevent latch-up of a semiconductor device. To this end, the concentration of a base connection region needs to be set high. In contrast, in the case of IGBT, holes flow from a collector region when the IGBT is in the ON state. Thus, generation of excess carriers is suppressed by setting the concentration of the collector region low. As a result, the current fall speed when the IGBT is turned off is increased.

The first semiconductor device fabrication method according to the present invention includes the steps of: selectively forming a RESURF region of a second conductivity type in an upper portion of a semiconductor substrate of a first conductivity type; forming a base region of the first conductivity type in an upper portion of the semiconductor substrate so as to be adjacent to the RESURF region; sequentially depositing and selectively forming a gate insulating film and a gate electrode on part of the RESURF region and part of the base region such that the gate insulating film and the gate electrode extend over the part of the RESURF region and the part of the base region; forming an emitter/source region of the second conductivity type in an upper portion of the base region so as to be adjacent to the gate electrode; forming a base connection region of the first conductivity type in an upper portion of the base region so as to be adjacent to the emitter/source region; forming a collector region of the first conductivity type in the RESURF region so as to be apart from the base region; forming an emitter/source electrode on the semiconductor substrate so as to be electrically connected to the base connection region and the emitter/source region; and generating lattice defect in the semiconductor substrate by irradiating the semiconductor substrate with an electron beam such that a resistance value of the semiconductor substrate is twice or more a resistance value of the semiconductor substrate that depends on a concentration of an impurity implanted in the semiconductor substrate.

According to the first semiconductor device fabrication method, carriers are trapped in the lattice defect when the semiconductor device is switched from ON state to OFF state. The current fall speed is therefore increased, and as a result, it is possible to achieve a semiconductor device capable of high-speed switching performance.

In the first semiconductor device fabrication method, it is preferable that the step of generating lattice defect includes irradiating a surface of the semiconductor substrate opposite to the RESURF region with the electron beam.

By doing so, generation of lattice defect at the interface between the base region, which is formed in an upper portion of the semiconductor substrate, and the gate insulating film formed on the base region is suppressed. Therefore, a leakage current generated because of lattice defect at the interface between the base region and the gate insulating film is prevented.

The second semiconductor device fabrication method according to the present invention includes the steps of: selectively forming a RESURF region of a second conductivity type in an upper portion of a semiconductor substrate of a first conductivity type; forming a base region of the first conductivity type in an upper portion of the semiconductor substrate so as to be adjacent to the RESURF region; sequentially depositing and selectively forming a gate insulating film and a gate electrode on part of the RESURF region and part of the base region such that the gate insulating film and the gate electrode extend over the part of the RESURF region and the part of the base region; forming an emitter/source region of the second conductivity type in an upper portion of the base region so as to be adjacent to the gate electrode; forming a base connection region of the first conductivity type in an upper portion of the base region so as to be adjacent to the emitter/source region; forming a collector region of the first conductivity type in the RESURF region so as to be apart from the base region; forming an emitter/source electrode on the semiconductor substrate so as to be electrically connected to the base connection region and the emitter/source region; and generating lattice defect in the semiconductor substrate by irradiating the semiconductor substrate with protons such that a resistance value of the semiconductor substrate is twice or more a resistance value of the semiconductor substrate that depends on a concentration of an impurity implanted in the semiconductor substrate.

According to the second semiconductor device fabrication method, carriers are trapped in the lattice defect when the semiconductor device is switched from ON state to OFF state. The current fall speed is therefore increased, and as a result, it is possible to achieve a semiconductor device capable of high-speed switching performance. Besides, the range of protons can be controlled within the thickness range of the semiconductor substrate. Thus, the use of protons makes it possible to form lattice defect only in the semiconductor substrate by setting the peak of implantation to a desired depth of the semiconductor substrate.

In the second semiconductor device fabrication method, it is preferable that the step of generating lattice defect includes irradiating a surface of the semiconductor substrate opposite to the RESURF region with protons.

By doing so, lattice defect is generated in the semiconductor substrate without making the protons reach the interface between the base region formed in an upper portion of the semiconductor substrate and the gate insulating film. As a result, a leakage current generated due to lattice defect at the interface between the base region and the gate insulating film is prevented.

It is preferable that the first or second semiconductor fabrication method further includes the step of forming in the RESURF region a drain region of the second conductivity type so as to be adjacent to the collector region.

By doing so, a single semiconductor device can function as two different types of transistors, MOSFET and IGBT.

Thus, the semiconductor device and the semiconductor device fabrication method of the present invention achieve a semiconductor device of low-on resistance and high breakdown voltage that is capable of high-speed switching by providing a semiconductor substrate having sufficient strength.

DETAILED DESCRIPTION OF THE INVENTION

Embodiment 1

A semiconductor device according to Embodiment 1 of the present invention is described with reference to the drawings.

Figure 1:
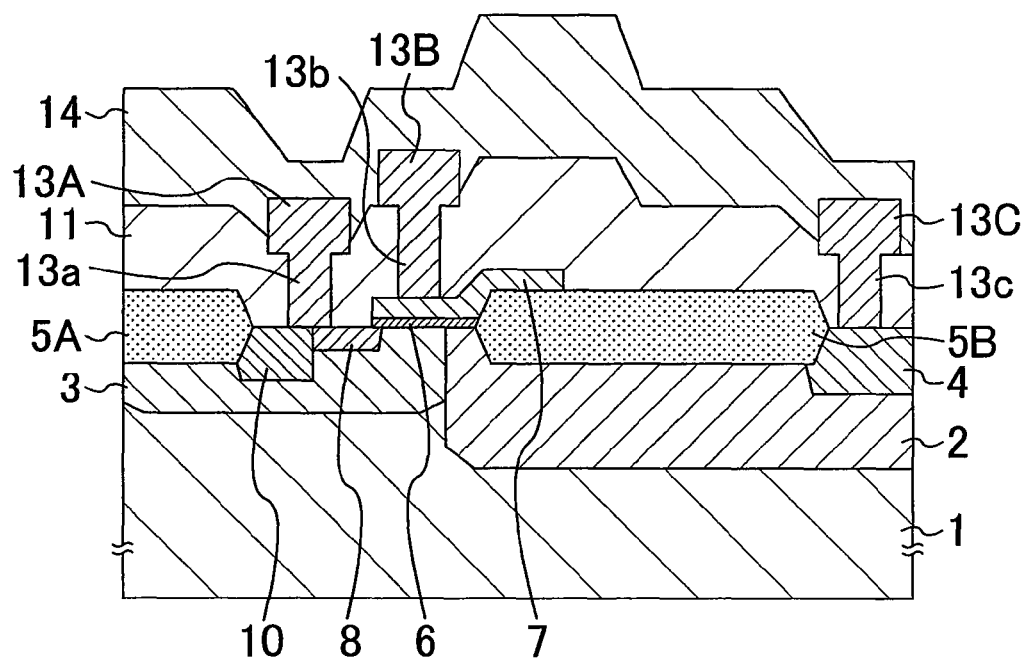
FIG. 1 is a cross sectional structure of an example of a semiconductor device (IGBT) according to Embodiment 1 of the present invention.

FIG. 1 shows an example of a semiconductor device of the present invention and illustrates a cross section of a power transistor which has a lateral IGBT structure including a RESURF (reduced surface field) region of a low concentration.

A semiconductor substrate 1 of P-type silicon (Si) has an impurity concentration of about $1 \times 10^{14}$ cm$^{-3}$ and a thickness of 200 μm to 400 μm. The semiconductor substrate 1 includes a RESURF region 2 formed of an N-type impurity layer which has an impurity concentration of about $1 \times 10^{16}$ cm$^{-3}$ to $5 \times 10^{16}$ cm$^{-3}$. The RESURF region 2 has a depth of about 3 μm to 5 μm from the upper surface of the semiconductor substrate 1. The semiconductor substrate 1 also includes a base region 3 formed of a P-type impurity layer having an impurity concentration of about $1 \times 10^{17}$ cm$^{-3}$, residing adjacent to the RESURF region 2.

A collector region 4 formed of a P-type impurity layer having an impurity concentration of about $2 \times 10^{16}$ cm$^{-3}$ to $1 \times 10^{17}$ cm$^{-3}$ is selectively provided in a portion of the RESURF region 2 that is apart from the base region 3.

An isolation film 5A of oxide silicon (SiO$_2$) is provided in a portion of the base region 3 that is apart from the RESURF region 2. An isolation film 5B of SiO$_2$ is provided in the RESURF region 2 except a portion where the collector region 4 and the junction between the base region 3 and the RESURF region 2 exist.

A gate insulating film 6 of oxide silicon (SiO$_2$) is provided on the semiconductor substrate 1 so as to extend over the junction between the RESURF region 2 and the base region 3. A gate electrode 7 of polysilicon is provided on the gate insulating film 6. The material of the gate electrode 7 is not limited to polysilicon, but silicide gate or metal gate may also be used as the gate electrode 7.

An emitter/source region 8 formed of a high concentration N-type diffusion layer having an impurity concentration of about $1 \times 10^{18}$ cm$^{-3}$ to $1 \times 10^{20}$ cm$^{-3}$ is provided in the base region 3 so as to be in contact with an edge of the gate insulating film 6. A base connection region 10 formed of a high concentration P-type diffusion layer having an impurity concentration of about $1 \times 10^{18}$ cm$^{-3}$ to $1 \times 10^{19}$ cm$^{-3}$ is also provided in the base region 3 so as to be adjacent to the emitter/source region 8.

An interlayer insulating film 11 formed of a laminated film of SiO$_2$ and BPSG (boro-phospho-silicate glass) for separating, for example, a gate interconnect and an emitter/source electrode (both described later) from each other is provided on the semiconductor substrate 1, as well as on the isolation films 5A and 5B and the gate electrode 7. A first contact 13a to which both the emitter/source region 8 and the base connection region 10 are electrically connected, a second contact 13b to which the gate electrode 7 is electrically connected, and a third contact 13c to which the collector region 4 is electrically connected are provided in the interlayer insulating film 11.

An emitter/source electrode 13A connected to the first contact 13a, a gate interconnect 13B connected to the second contact 13b, and a collector electrode 13C connected to the third contact 13c are provided on the interlayer insulating film 11. The emitter/source electrode 13A, the gate interconnect 13B, and the collector electrode 13C are formed of an aluminum alloy.

A protection film (passivation film) 14 of $Si_3N_4$ is provided on the interlayer insulating film 11 so as to cover the emitter/source electrode 13A, the gate interconnect 13B, and the collector electrode 13C. These structures as in the above form a lateral IGBT.

A feature of the present invention resides in that the P-type Si semiconductor substrate 1 has lattice defect such that the resistance value of the semiconductor substrate 1 is approximately twice to four times the resistance value of the semiconductor substrate 1 that depends on the concentration of the P-type impurity implanted in the semiconductor substrate 1.

Figure 2:
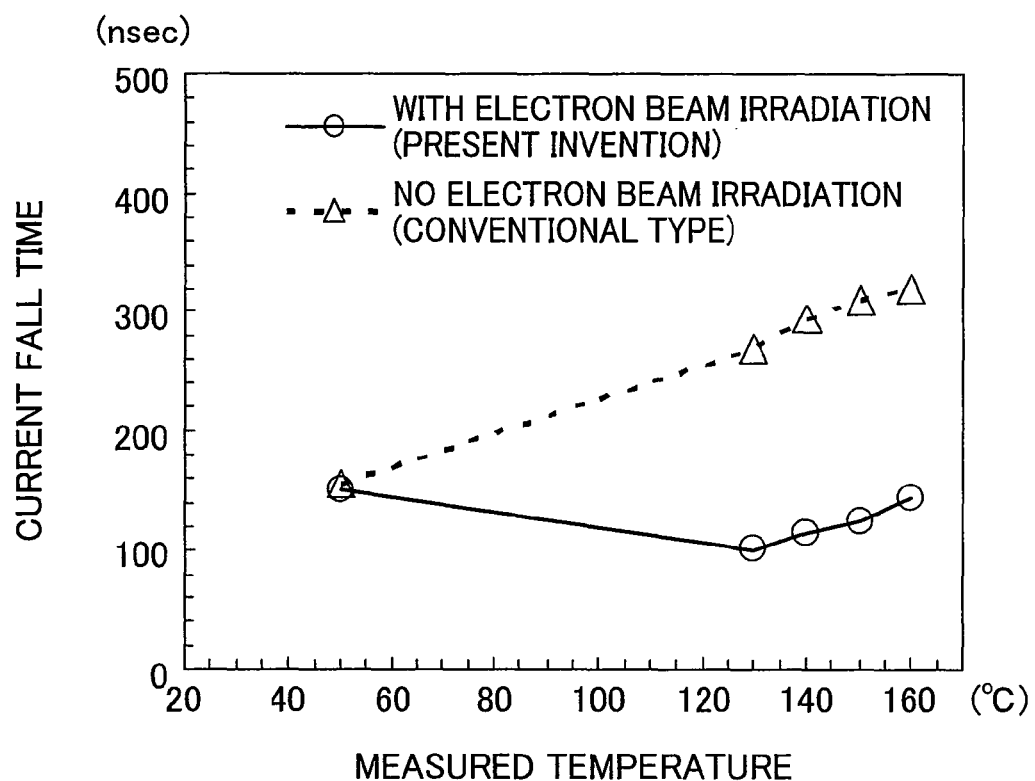
FIG. 2 is a graph comparing the current fall time of the semiconductor device according to Embodiment 1 of the present invention and the current fall time of a conventional semiconductor device.

As seen from the broken line with triangles of FIG. 2, which line represents no electron beam irradiation, the current fall time when the IGBT with no lattice defect is switched from ON state to OFF state depends on the carrier mobility. Thus, the current fall time of a conventional type device (broken line with triangles) becomes longer as the temperature increases. In contrast, according to the present invention (line with circles), the lifetime of carriers is shortened by lattice defect generated in the semiconductor substrate. Therefore, the current fall time (line with circles) is especially shorter at higher temperatures as seen from FIG. 2.

Figure 3:
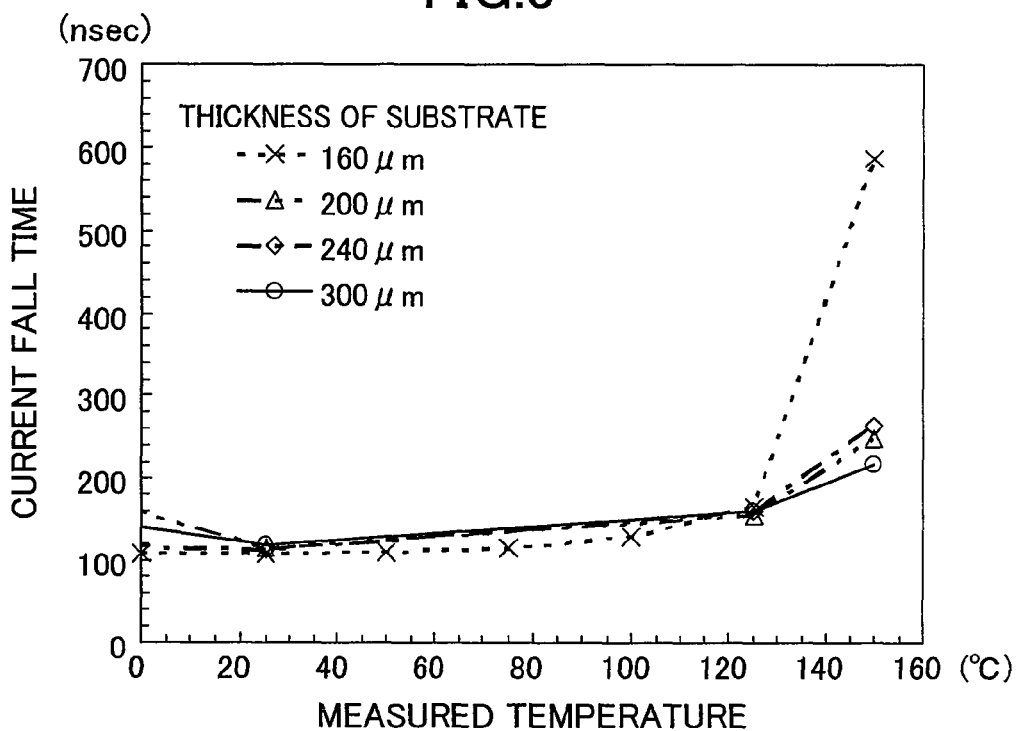
FIG. 3 is a graph showing the dependence of the current fall time of a semiconductor device on the thickness of a semiconductor substrate and the temperature.

In addition, the inventors of the present invention found that, in the case where an attempt is made to reduce current fall time under high temperatures by generating lattice defect in the P-type Si semiconductor substrate 1, adjusting the thickness of the semiconductor substrate 1 to 200 µm or more to increase the total amount of lattice defect, which functions as a trap center for a carrier, is effective in increasing the current fall speed as shown in FIG. 3.

In a lateral IGBT, a thicker semiconductor substrate 1 contributes to higher collector breakdown voltage. The collector breakdown voltage of the lateral IGBT depends on the lateral length of the RESURF region 2 (dimension parallel to the substrate surface). Reduction in the thickness of the semiconductor substrate 1 results in reduction in the distance between the RESURF region 2 and the back side electrode (electrode provided on the surface of the semiconductor substrate 1 opposite to the gate electrode 7). In this case, punch-though may decrease the breakdown voltage. With the thickness of the semiconductor substrate 1 being 200 µm or more as in the present invention, punch-through is not generated even if the breakdown voltage is about 1200 V.

In addition, fabrication of the lateral IGBT becomes easier if the thickness of the semiconductor substrate 1 is 200 µm or more. If the semiconductor substrate 1 has a thickness of 200 µm or more, sufficient substrate strength is ensured while the semiconductor substrate 1 is treated. Hence, the probability of breakage of the semiconductor substrate 1 is avoided in the step of, for example, carrying out vacuum vapor deposition of a metal film on the back face of the semiconductor substrate 1 after element formation. This enhances fabrication yield.

Although in the Embodiment 1 an example in which lattice defect is generated only in the semiconductor substrate 1 is described, the lattice defect may be generated not only in the semiconductor substrate 1 but also in the N-type RESURF region 2 and the P-type base region 3. In doing so, the lifetime of carriers is shortened also in the RESURF region 2 and the base region 3. As a result, the current fall speed is further increased when the IGBT is turned off.

Figure 4:
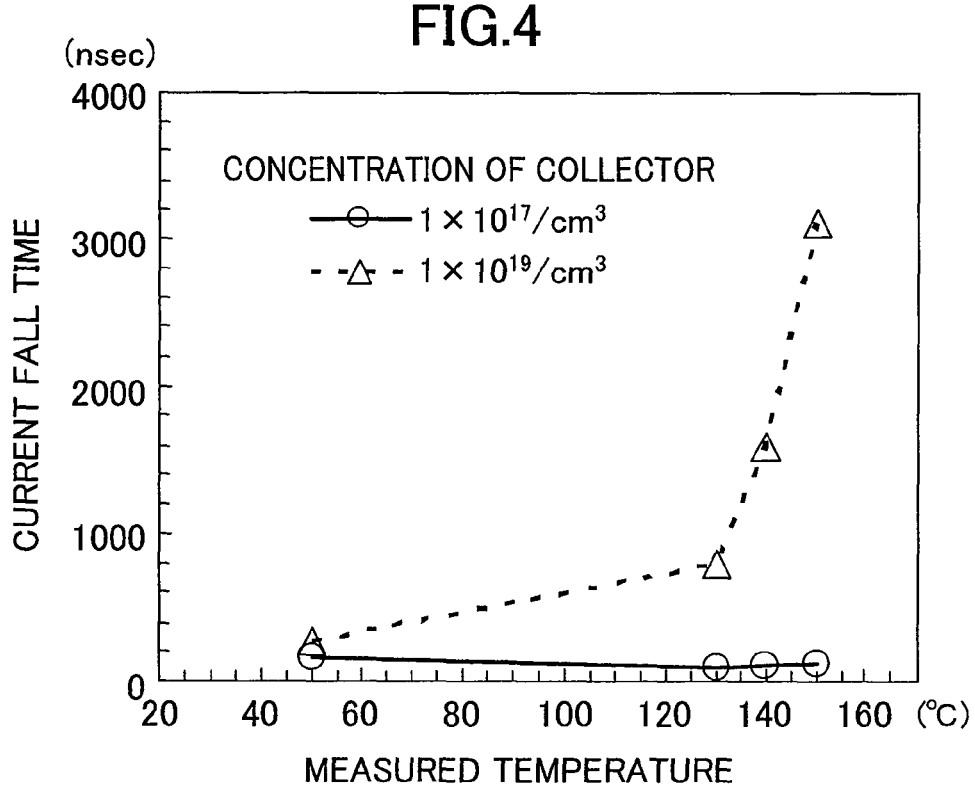
FIG. 4 is a graph showing the dependence of the current fall time of a semiconductor device on the collector concentration and the temperature.

IGBT is a device in which latch-up due to a parasitic thyristor effect easily occurs. To avoid this latch-up, it is preferable to reduce as much connection resistance of the P-type base region 3 as possible and thereby suppress increase in electric potential of the base region 3. To this end, the impurity concentration of the P-type base connection region 10 is set to a high concentration of about $1\times10^{19}$ cm$^{-3}$ as mentioned in the above. In contrast, holes flow from the P-type collector region 4 when the IGBT is in ON state. Thus, as shown in FIG. 4, the impurity concentration of the P-type collector region 4 is set to a low concentration of about $1\times10^{17}$ cm$^{-3}$ or less in order to suppress generation of excess carriers. This can lead to increase in the current fall speed.

Figure 5:
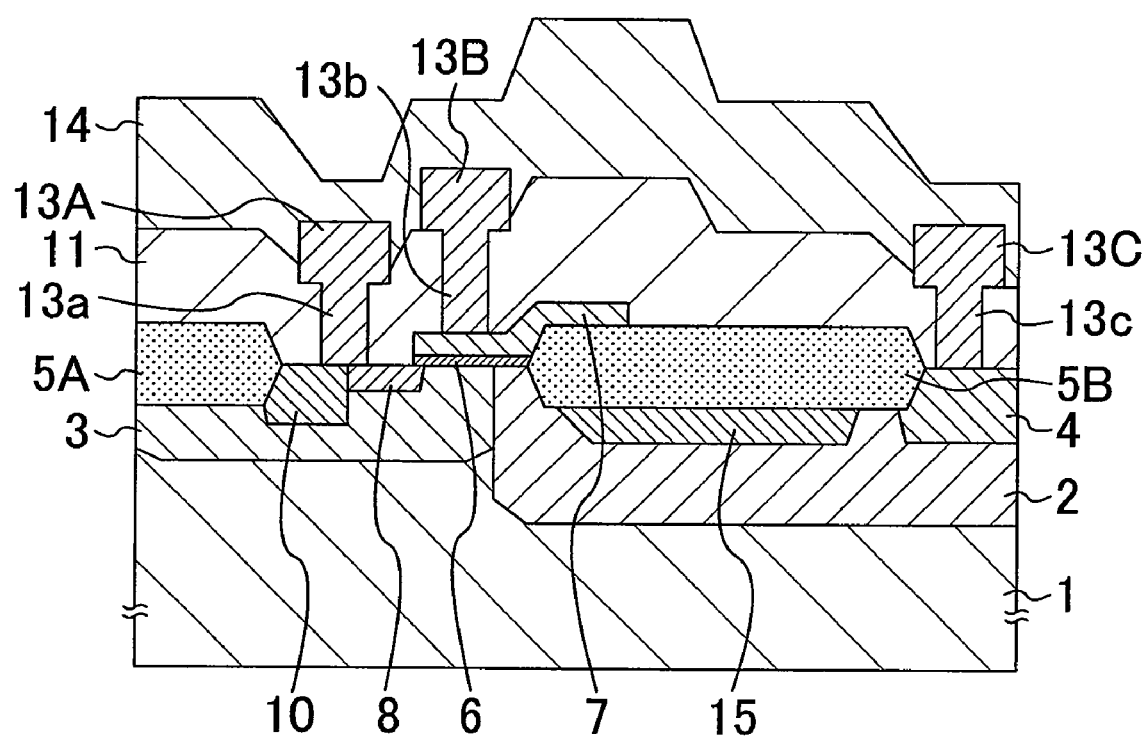
FIG. 5 is a cross sectional structure of a semiconductor device (IGBT) according to a variation of Embodiment 1 of the present invention.

FIG. 5 shows a variation of the semiconductor device of FIG. 1 having a simple RESURF structure. As shown in FIG. 5, a P-type impurity layer 15 having an impurity concentration of about $2\times10^{16}$ cm$^{-3}$ to $1\times10^{17}$ cm$^{-3}$ may be provided in a portion of the N-type RESURF region 2 that is directly under the isolation film 5B. Because of this structure, where part of the N-type RESURF region 2 is vertically sandwiched between the P-type impurity layer 15 and the P-type semiconductor substrate 1, depletion is easily caused in the RESURF region 2. As a result, it becomes possible to increase the impurity concentration of the RESURF region 2 of the semiconductor device whose breakdown voltage is the same as the breakdown voltage of the semiconductor device of FIG. 1. This structure reduces the time for holes to disappear in the RESURF region 2 when the IGBT is switched to OFF state. As a result, the current fall speed is further increased.

(First Fabrication Method)

Hereinafter, the first fabrication method of the semiconductor device having the structure of FIG. 1 according to Embodiment 1 is described with reference to the drawings.

FIG. 6A to FIG. 6C, FIG. 7A to FIG. 7C, FIG. 8A to FIG. 8C, and FIG. 9 are cross sectional structures of the semiconductor device according to Embodiment 1 of the present invention, arranged in the order of steps of the first fabrication method.

Figure 6A:
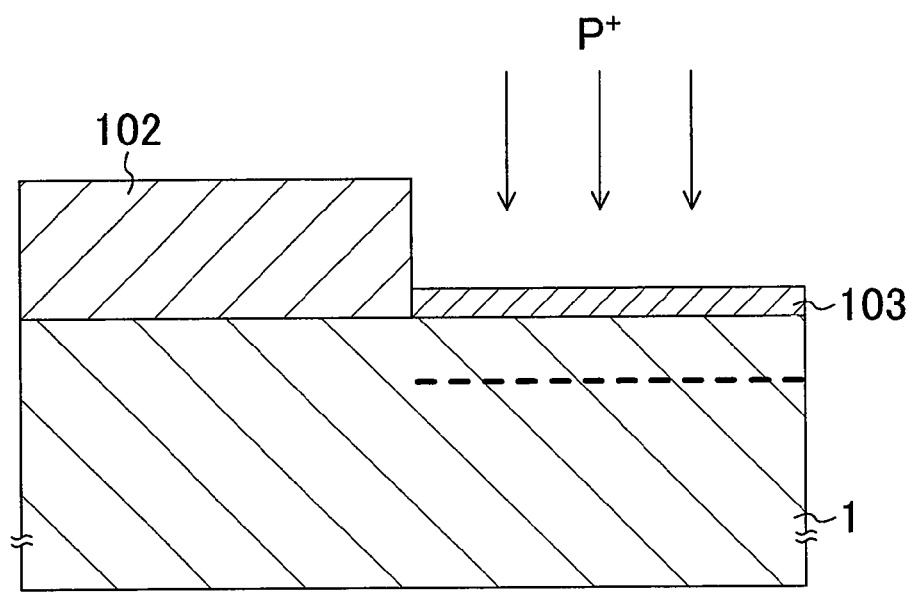
FIG. 6A through FIG. 6C are cross sections of the semiconductor device according to Embodiment 1 of the present invention, arranged in the order of steps of the first fabrication method.

Referring to FIG. 6A, a first mask film 102 of $SiO_2$ is formed on a P-type Si semiconductor substrate 1. The semiconductor substrate 1 has a thickness of about 500 µm to 650 µm and an impurity concentration of about $1\times10^{14}$ cm$^{-3}$. Then, a first resist pattern (not shown) having an opening in a portion corresponding to a RESURF region is formed on the first mask film 102. The first mask film 102 is etched using the first resist pattern as a mask, and the first resist pattern is removed, whereby a desired first mask film 102 is obtained. Next, phosphorous ions (P$^+$) are implanted at a dose of about $1\times10^{12}$ cm$^{-2}$ to $1\times10^{13}$ cm$^{-2}$, using the first mask film 102 as a mask. Herein, a thin protection film 103 of $SiO_2$ is formed on the portion corresponding to the RESURF region to protect the surface of the semiconductor substrate 1.

Figure 6B:
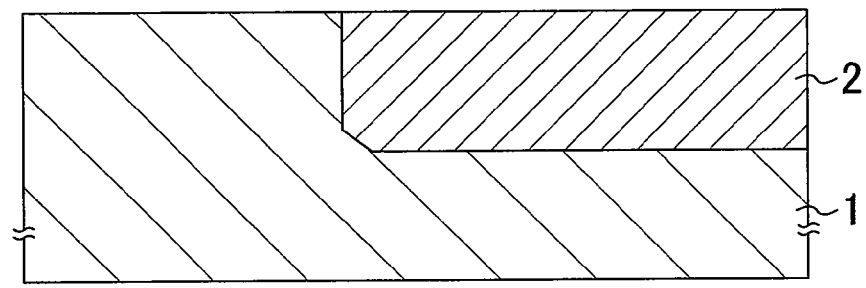

Next, referring to FIG. 6B, the semiconductor substrate 1, to which phosphorous ions have been implanted, is subjected to a thermal treatment in a nitrogen atmosphere at about 1200° C. for about three to six hours to diffuse the phosphorous ions. As a result, an N-type RESURF region 2 having a depth of about 5 μm and an impurity concentration of about $1 \times 10^{16}$ cm$^{-3}$ to $5 \times 10^{16}$ cm$^{-3}$ is formed.

Figure 6C:
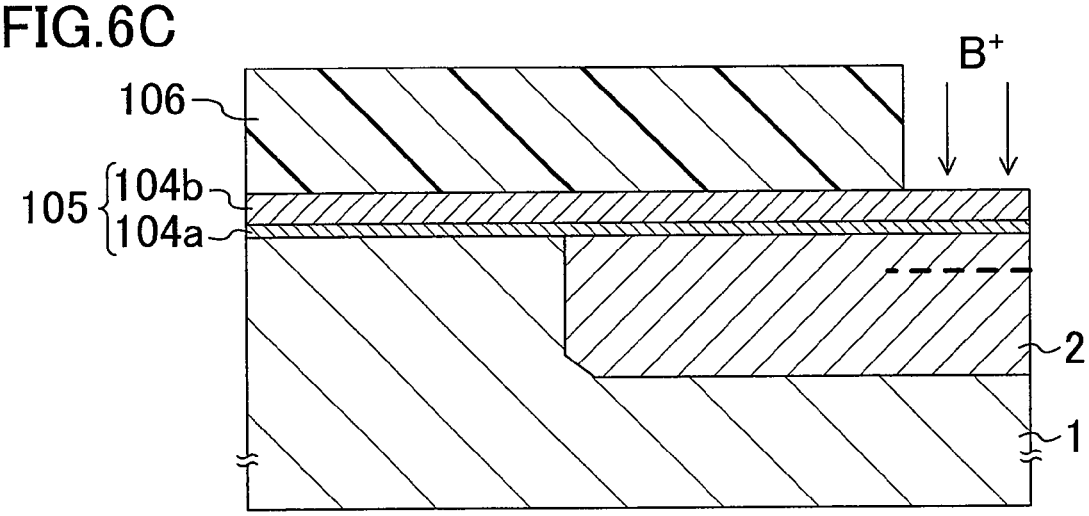

Next, referring to FIG. 6C, a second mask film 105 formed of an SiO$_2$ film 104a and an Si$_3$N$_4$ film 104b is formed on the entire surface of the semiconductor substrate 1. Then, a second resist pattern 106 having an opening in a portion corresponding to a collector region is formed on the second mask film 105. Boron ions (B$^+$) are implanted in the semiconductor substrate 1 at a dose of about $1 \times 10^{13}$ cm$^{-2}$ to $5 \times 10^{13}$ cm$^{-2}$, using the second resist pattern 106 as a mask, such that the boron ions pass through the second mask film 105.

Figure 7A:
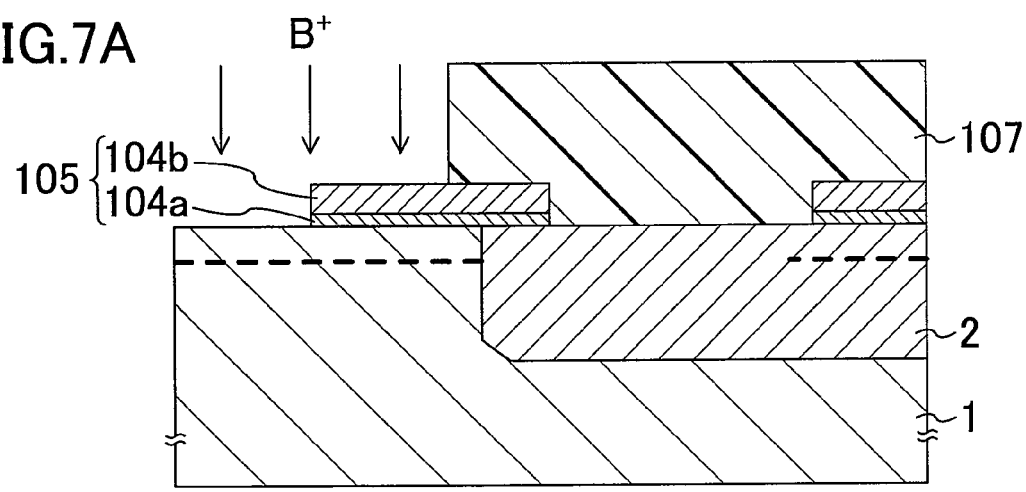
FIG. 7A through FIG. 7C are cross sections of the semiconductor device according to Embodiment 1 of the present invention, arranged in the order of steps of the first fabrication method.

Next, referring to FIG. 7A, the second resist pattern 106 is removed, and then, the second mask film 105 is patterned using a third resist pattern (not shown) having an opening in an isolation film formation region. Then, a fourth resist pattern 107 having an opening in a portion corresponding to a base region is formed on the semiconductor substrate 1 as well as on the patterned second mask film 105. Boron ions (B$^+$) are implanted in the semiconductor substrate 1 at a dose of about $2 \times 10^{12}$ cm$^{-2}$ to $5 \times 10^{12}$ cm$^{-2}$, using the fourth resist pattern 107 as a mask, such that the boron ions pass through the second mask film 105.

Figure 7B:
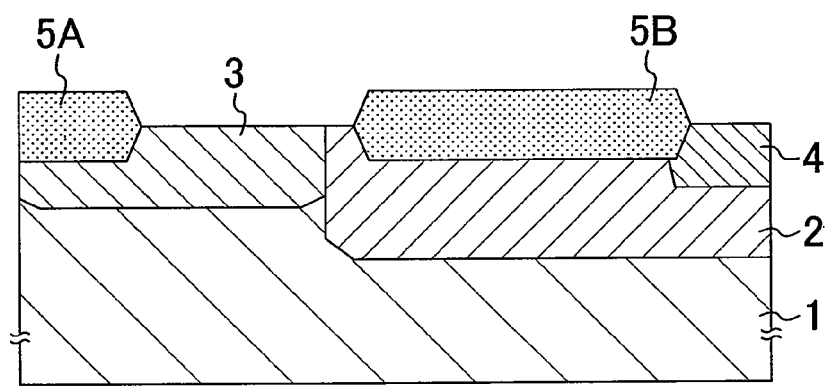

Next, referring to FIG. 7B, the fourth resist pattern 107 is removed, and then, the semiconductor substrate 1, to which boron ions have been implanted, is subjected to a thermal oxidation in an oxidizing atmosphere. After that, the second mask film 105 is removed. In doing so, isolation films 5A and 5B are formed, and the boron ions implanted in the steps shown in FIG. 6C and FIG. 7A are diffused. As a result, a base region 3 and a collector region 4 which have an impurity concentration of about $2 \times 10^{16}$ cm$^{-3}$ to $1 \times 10^{18}$ cm$^{-3}$ are formed.

Figure 7C:
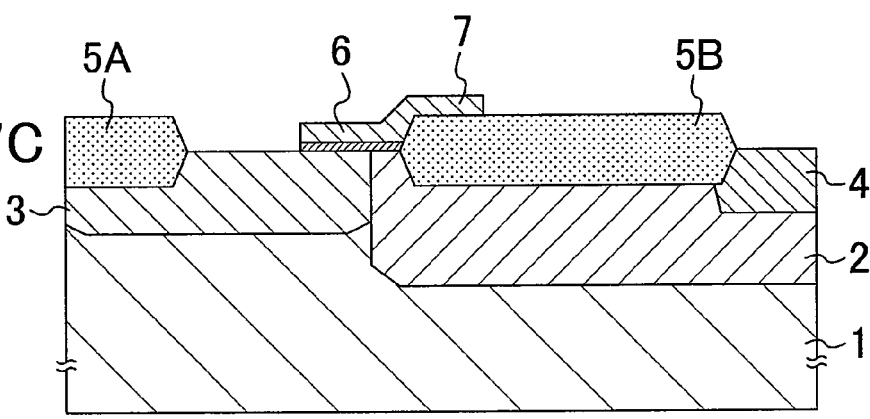

Next, referring to FIG. 7C, a gate insulating film 6 of SiO$_2$ is formed by a thermal oxidation method or the like on the surface of the semiconductor substrate 1 in which the isolation films 5A and 5B are formed. Then, a polysilicon film is deposited on the entire surface of the semiconductor substrate 1 by a chemical vapor deposition (CVD) method or the like. After that, the polysilicon film and the gate insulating film 6 are patterned by etching, using a fifth resist pattern (not shown) having a gate electrode formation pattern. As a result, the gate insulating film 6 extends over the junction between the RESURF region 2 and the base region 3, and a polysilicon gate electrode 7 of IGBT is formed at least on the patterned gate insulating film 6.

Figure 8A:
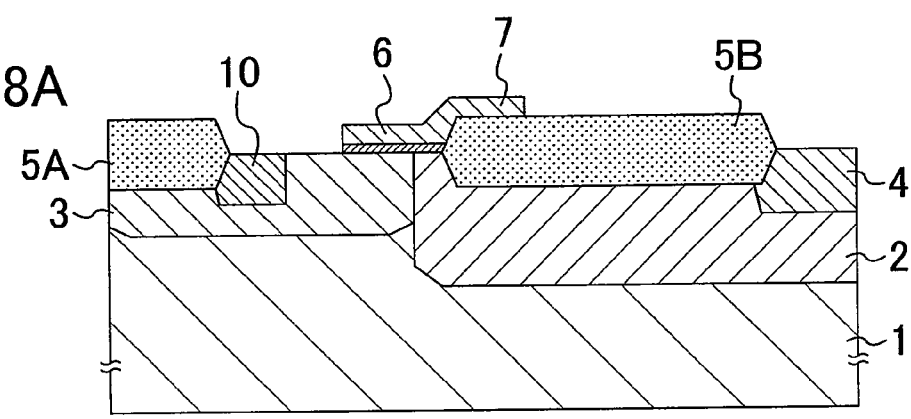
FIG. 8A through FIG. 8C are cross sections cross sections of the semiconductor device according to Embodiment 1 of the present invention, arranged in the order of steps of the first fabrication method.

Next, referring to FIG. 8A, the fifth resist pattern is removed, and then, boron ions (B$^+$) are implanted in the semiconductor substrate 1 at a dose of about $1 \times 10^{15}$ cm$^{-2}$ to $5 \times 10^{15}$ cm$^{-2}$, using a sixth resist pattern (not shown) having an opening in a portion corresponding to a base connection region as a mask. The sixth resist pattern is removed thereafter and a thermal treatment is carried out to form a high concentration base connection region 10 having an impurity concentration of about $1 \times 10^{18}$ cm$^{-3}$ to $1 \times 10^{20}$ cm$^{-3}$.

Figure 8B:
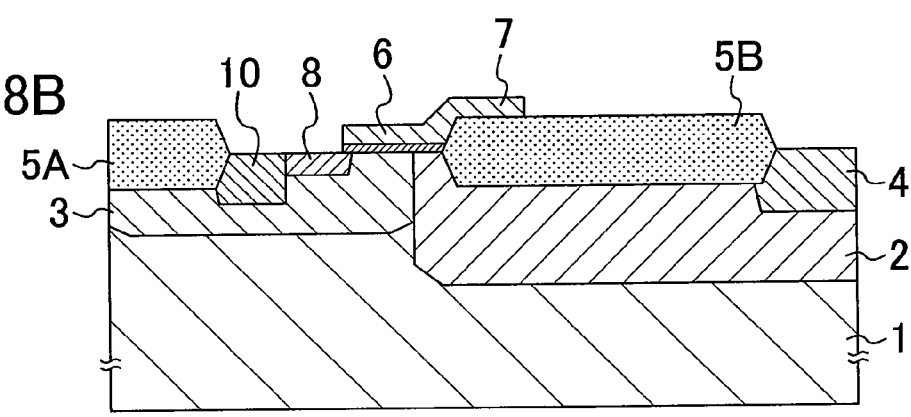

Next, referring to FIG. 8B, arsenic ions (As$^+$) are implanted in the semiconductor substrate 1 at a dose of about $1 \times 10^{15}$ cm$^{-2}$ to $8 \times 10^{15}$ cm$^{-2}$, using the gate electrode 7 and a seventh resist pattern (not shown) having an opening in a portion corresponding to an emitter/source region as a mask. The seventh resist pattern is removed thereafter and a thermal treatment is carried out to form a high concentration emitter/source region 8 having an impurity concentration of about $1 \times 10^{18}$ cm$^{-3}$ to $1 \times 10^{21}$ cm$^{-3}$. Herein, the fabrication order of the base connection region 10 and the emitter/source region 8 is not limited to the above order, but may be changed.

Figure 8C:
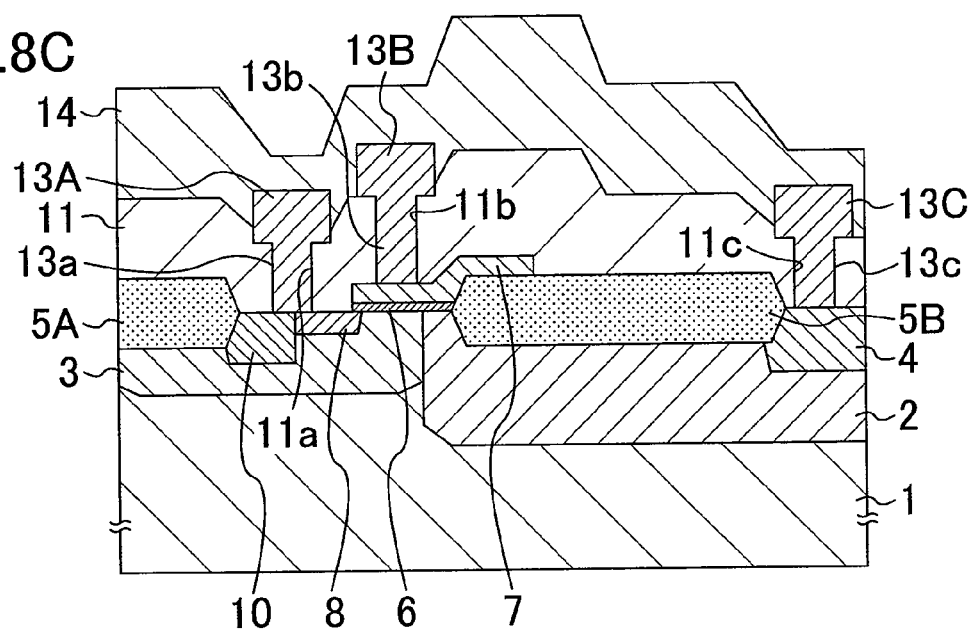

Next, referring to FIG. 8C, an SiO$_2$ film and a BPSG film are formed in this order on the entire semiconductor substrate 1 as well as on the isolation films 5A and 5B and on the gate electrode 7 by a CVD method to form an interlayer insulating film 11. Then, the deposited interlayer insulating film 11 is subjected to a thermal treatment at 900° C. In doing so, the surface of the interlayer insulating film 11 is planarized.

Then, the interlayer insulating film 11 is etched using, as a mask, an eighth resist pattern (not shown) having openings for formation of contact holes. As a result, a first contact hole 11a which exposes both of the base connection region 10 and the emitter/source region 8, a second contact hole 11b which exposes the gate electrode 7, and a third contact hole 11c which exposes the collector region 4 are formed. After that, the eighth resist pattern is removed, and then, an alloy film including aluminum (Al) as a main component, such as AlSiCu, is deposited by, for example, a sputtering method on the interlayer insulating film 11, in which the contact holes 11a, 11b and 11c have been formed. At this time, the contact holes 11a, 11b and 11c are filled with the alloy film, and as a result, a first contact 13a, a second contact 13b, and a third contact 13c are formed.

Then, a ninth resist pattern (not shown) having an interconnect pattern and an electrode pattern is formed on the deposited alloy film. The alloy film is patterned using the ninth resist pattern as a mask. As a result, an emitter/source electrode 13A connected to the first contact 13a, a gate interconnect 13B connected to the second contact 13b, and a collector electrode 13C connected to the third contact 13c are formed.

Then, the ninth resist pattern is removed, and thereafter, a protection film 14 of SiN is formed by a plasma CVD method on the interlayer insulating film 11, in which an interconnect and an electrode are formed. In this way, a power transistor having a lateral IGBT structure including a low concentration N-type RESURF region 2 and a P-type collector region 4 formed in the RESURF region 2 is obtained.

Figure 9:
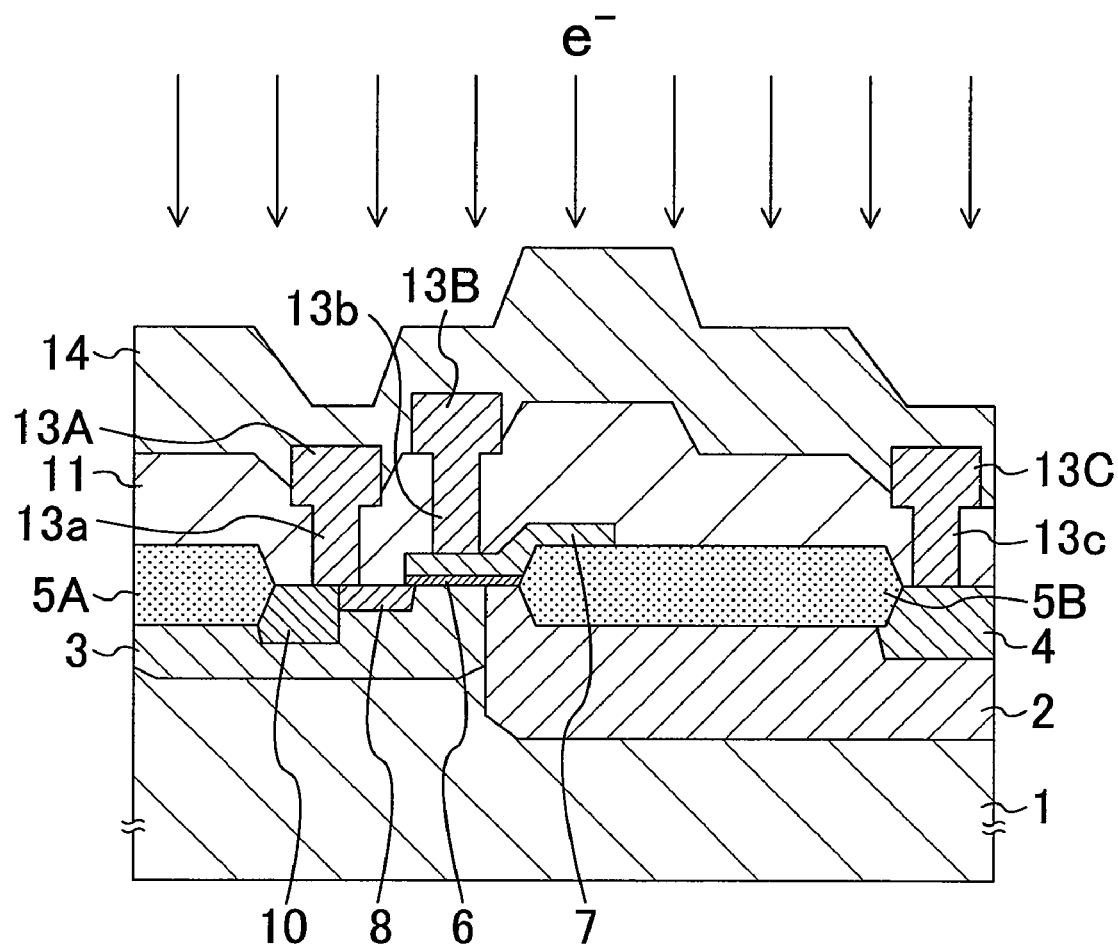
FIG. 9 is a cross section of the semiconductor device according to Embodiment 1 of the present invention, illustrating a step of the first fabrication method.

Next, referring to FIG. 9, the semiconductor substrate 1 is irradiated with an electron beam having an acceleration energy of about several hundred KeV to several MeV with the irradiation amount of about 200 kGy to 1000 kGy from the protection film 14 side. The semiconductor substrate 1 after irradiation with the electron beam is annealed at 300° C. to 400° C. to generate lattice defect in the semiconductor substrate 1 and to appropriately recover lattice defect which is formed, for example, in the interface between the semiconductor substrate 1 and the gate insulating film 6.

Figure 10:
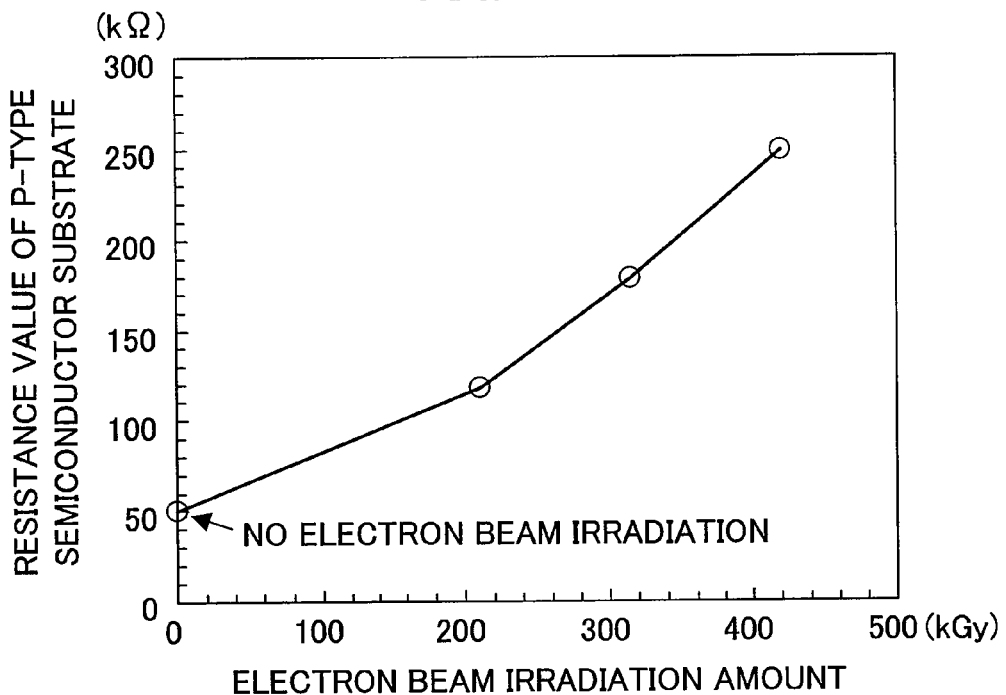
FIG. 10 is a graph showing the dependence of a resistance value of a P-type semiconductor substrate on the electron beam irradiation amount.

FIG. 10 shows the measurement result of the relationship between the amount of electron beam irradiation and the substrate resistance. As shown in FIG. 10, lattice defect is generated in the P-type Si semiconductor substrate 1 in the amount that makes the semiconductor substrate 1 have a resistance value approximately twice to five times the resistance value of a semiconductor substrate of a conventional type device in which the semiconductor substrate is not irradiated with an electron beam.

After irradiating the semiconductor substrate 1 with the electron beam, the surface of the semiconductor substrate 1 opposite to the protection film 14 is ground so that the thickness of the semiconductor substrate 1 is 200 μm to 400 μm (back side polishing).

As in the above, according to the first fabrication method of Embodiment 1, lattice defect is generated in the semiconductor substrate 1 and the semiconductor substrate 1 is made to have a thickness of 200 μm or more. As a result, the current fall speed especially under high temperatures is increased when the IGBT is turned off as mentioned in the above.

Figure 11:
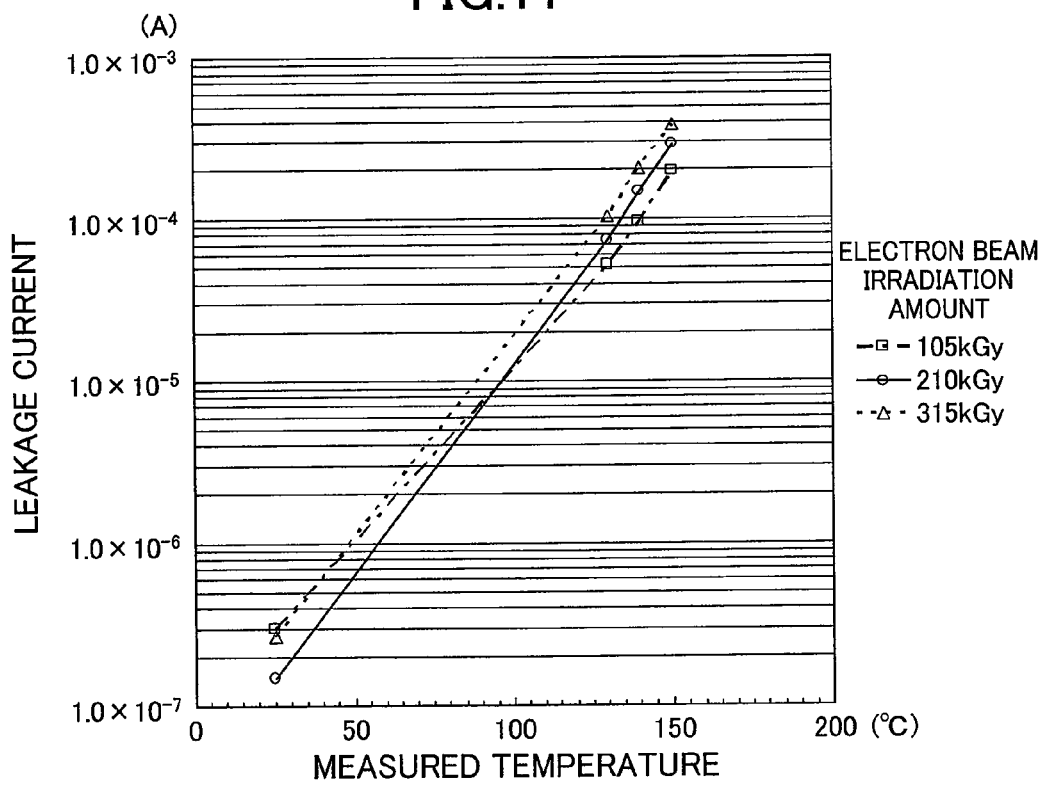
FIG. 11 is a graph showing the dependence of a leakage current of IGBT on the electron beam irradiation amount and the temperature.

In the first fabrication method, the semiconductor substrate 1 is irradiated with the electron beam from the upper face thereof to generate lattice defect in the semiconductor substrate 1. However, as in FIG. 11 showing the relationship between the amount of electron beam irradiation and a leakage current when the gate of IGBT is in OFF state, lattice defect formed in the interface between the gate insulating film 6 and the base region 3 as a result of electron beam irradiation is a cause of a leakage current of the IGBT especially under high temperatures.

Accordingly, as a variation of the first fabrication method, the semiconductor substrate 1 is irradiated with the electron beam from the back face thereof to generate lattice defect in the semiconductor substrate 1 while suppressing the generation of lattice defect in the interface between the gate insulating film 6 and the base region 3. In doing so, the current fall speed of IGBT is increased and the leakage current is reduced. As a result, IGBT capable of higher performance is achieved.

(Second Fabrication Method)

Hereinafter, the second fabrication method of the semiconductor device having the structure of FIG. 1 according to Embodiment 1 is described with reference to the drawings.

Figure 12:
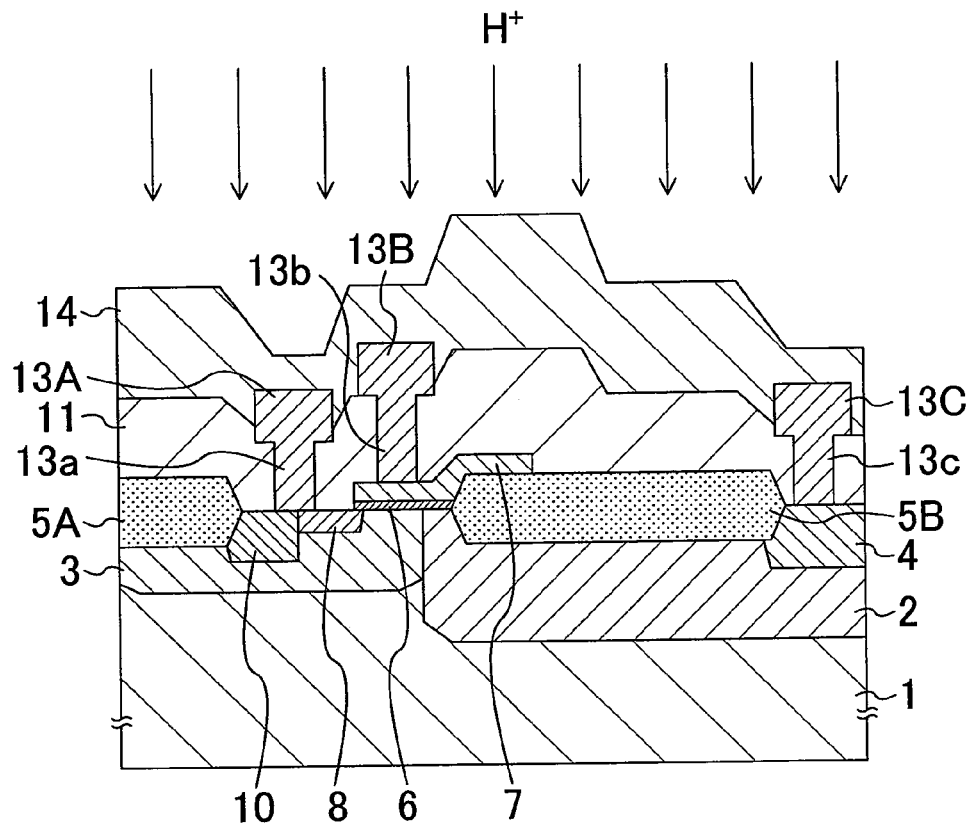
FIG. 12 is a cross section of the semiconductor device according to Embodiment 1 of the present invention, illustrating a step of the second fabrication method.

FIG. 12 is a cross sectional structure of the semiconductor device according to Embodiment 1 of the present invention, illustrating a step of the second fabrication method.

The second fabrication method differs from the first fabrication method in that protons ($H^+$) are used, instead of using an electron beam, to generate lattice defect in the semiconductor substrate 1.

Referring to FIG. 12, a protection film 14 is formed by the step illustrated in FIG. 8C to cover the interlayer insulating film 11 and the electrodes in the same manner as in the first fabrication method. After that, the semiconductor substrate 1 is irradiated with protons ($H^+$) having an acceleration energy of about several MeV to tens of MeV at a dose of about $5 \times 10^{10}$ cm$^{-2}$ to $1 \times 10^{12}$ cm$^{-2}$ from the protection film 14 side. Then, the semiconductor substrate 1 irradiated with protons is annealed at 300° C. to 400° C. so that lattice defect is generated in the semiconductor substrate 1. As a result, lattice defect is generated in the P-type Si semiconductor substrate 1 in the amount that makes the semiconductor substrate 1 have a resistance value approximately twice to five times the initial resistance value of the semiconductor substrate 1.

Thereafter, the semiconductor substrate 1 is polished so that the thickness of the semiconductor substrate 1 is 200 μm to 400 μm in the same manner as in the first fabrication method.

In the second fabrication method, too, lattice defect is generated in the semiconductor substrate 1 and the semiconductor substrate 1 is made to have a thickness of 200 μm or more in the same manner as in the first fabrication method. As a result, the current fall speed especially under high temperatures is increased when the IGBT is turned off as mentioned in the above.

In the second fabrication method, too, the semiconductor substrate 1 is irradiated with the electron beam from the back face thereof, as a variation of the first fabrication method, to generate lattice defect in the semiconductor substrate 1 while suppressing the generation of lattice defect in the interface between the gate insulating film 6 and the base region 3. In doing so, the current fall speed of IGBT is increased and the leakage current is reduced. As a result, IGBT capable of higher performance is achieved.

The implantation projected range of protons is shorter than that of an electron beam. Thus, by irradiating the semiconductor substrate 1 with protons from the back face of the semiconductor substrate 1, the range of protons is more easily controlled than the range of an electron beam so that the lattice defect is generated only in the semiconductor substrate 1. For this reason, protons lend themselves to obtainment of higher-performance IGBT.

Embodiment 2

A semiconductor device according to Embodiment 2 of the present invention is hereinafter described with reference to the drawings.

Figure 13:
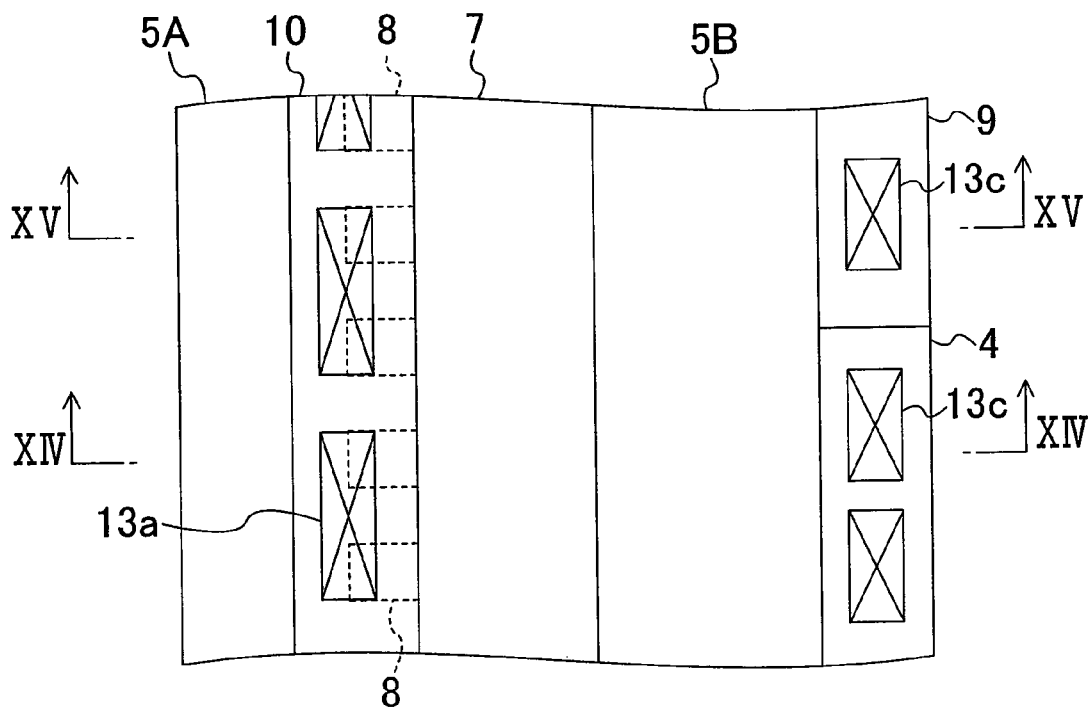
FIG. 13 is a plan view showing an example of a semiconductor device according to Embodiment 2 of the present invention.
Figure 14:
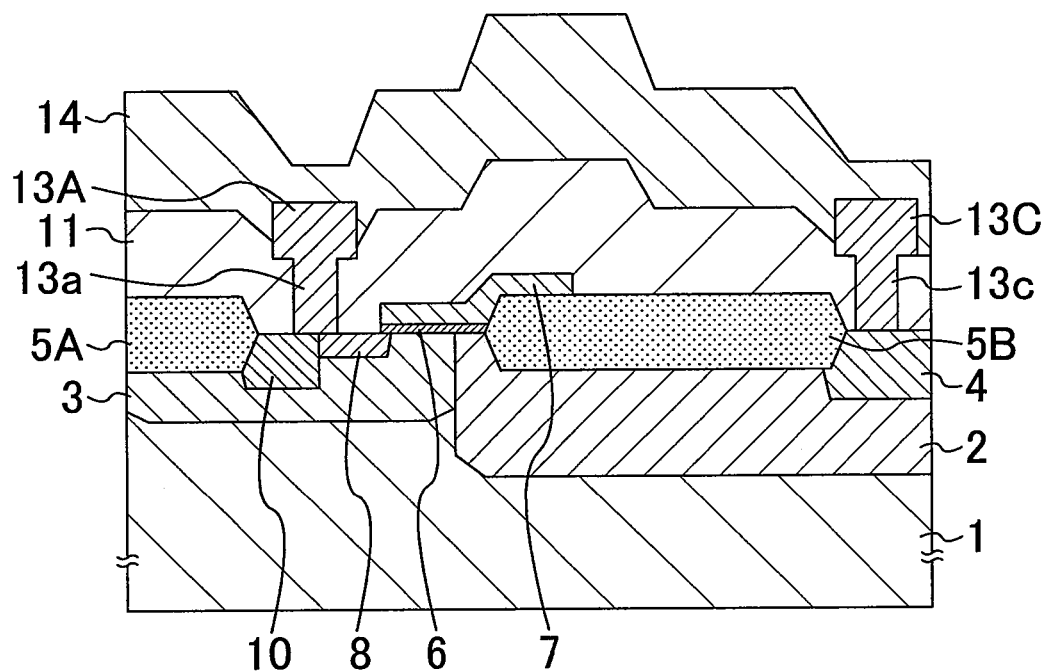
FIG. 14 is a cross section taken along the line XIV-XIV of FIG. 13.

FIG. 13 is an example of a semiconductor device according to the present invention which includes a low concentration RESURF region. FIG. 13 shows a plan view of a power transistor having characteristics of both of a lateral MOSFET and a lateral IGBT. FIG. 14 shows a cross sectional structure taken along the line XIV-XIV of FIG. 13, and FIG. 15 shows a cross sectional structure taken along the line XV-XV of FIG. 13.

Figure 15:
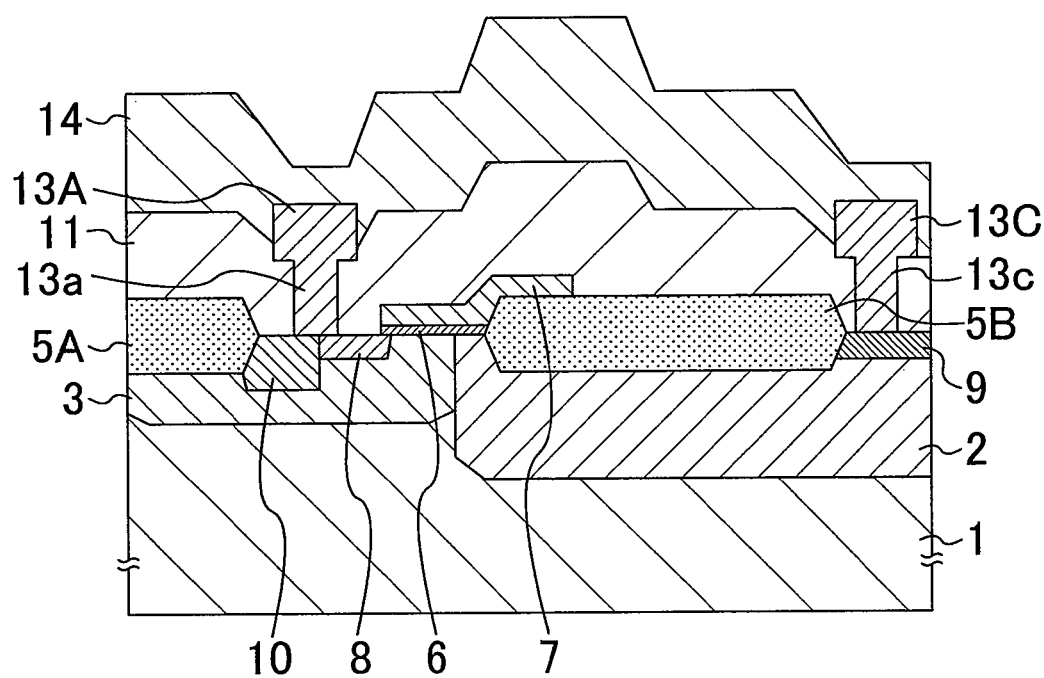
FIG. 15 is a cross section taken along the line XV-XV of FIG. 13.

Structural elements of FIG. 13 through FIG. 15 that are identical with the elements of FIG. 1 are labeled with the same reference numerals and the descriptions thereof are herein omitted.

As shown in FIG. 13 through FIG. 15, an N-type drain region 9 is provided in an upper portion of the N-type RESURF region 2 which is formed selectively in an upper portion of the semiconductor substrate 1. The drain region 9 is adjacent to the P-type collector region 4 formed in a portion apart from the gate electrode 7, and the drain region 9 has a high impurity concentration of about $1 \times 10^{18}$ cm$^{-3}$ to $1 \times 10^{20}$ cm$^{-3}$.

This means that the part including the cross section of FIG. 14 taken along the line XIV-XIV of FIG. 13 has a lateral IGBT structure and the part including the cross section of FIG. 15 taken along the line XV-XV of FIG. 13 has a lateral MOSFET structure. Herein, the reference numeral 13C represents a collector/drain electrode which is electrically connected to both of the collector region 4 and the drain region 9.

Figure 16:
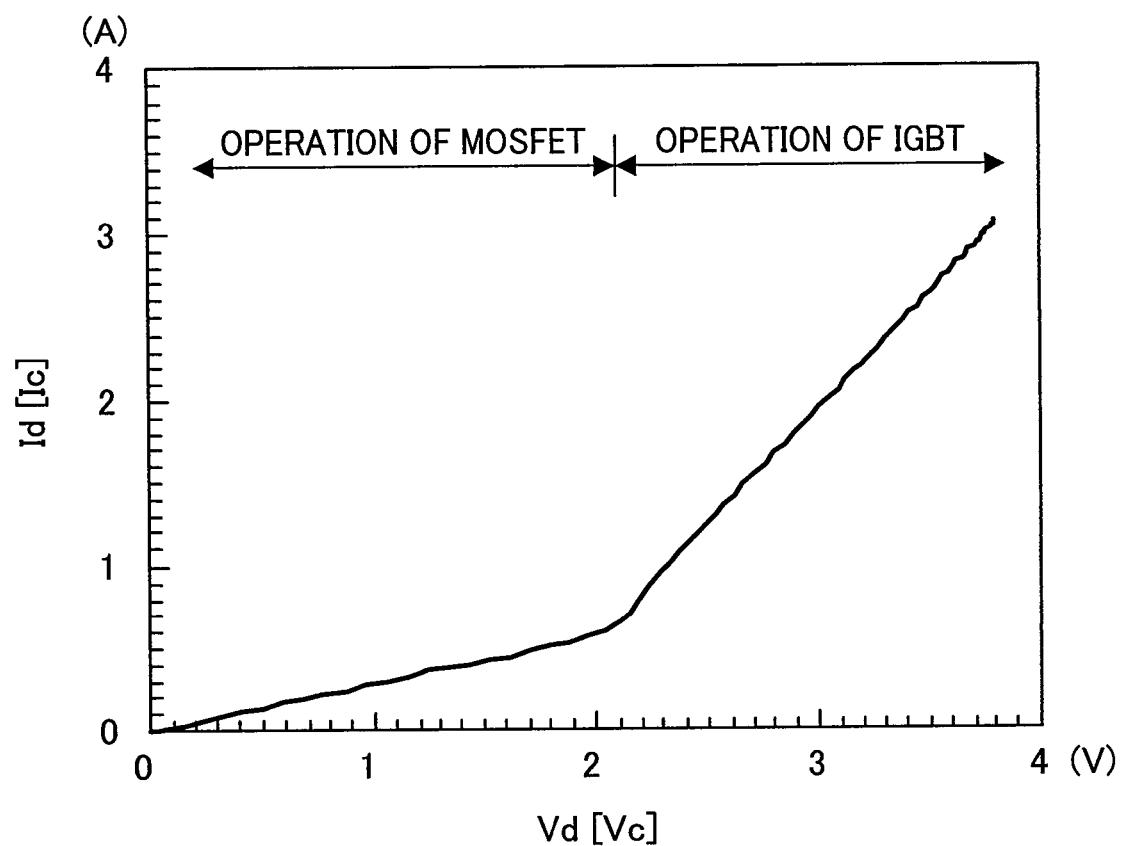
FIG. 16 is a graph showing I-V characteristics of the semiconductor device according to Embodiment 2 of the present invention.
Figure 17:
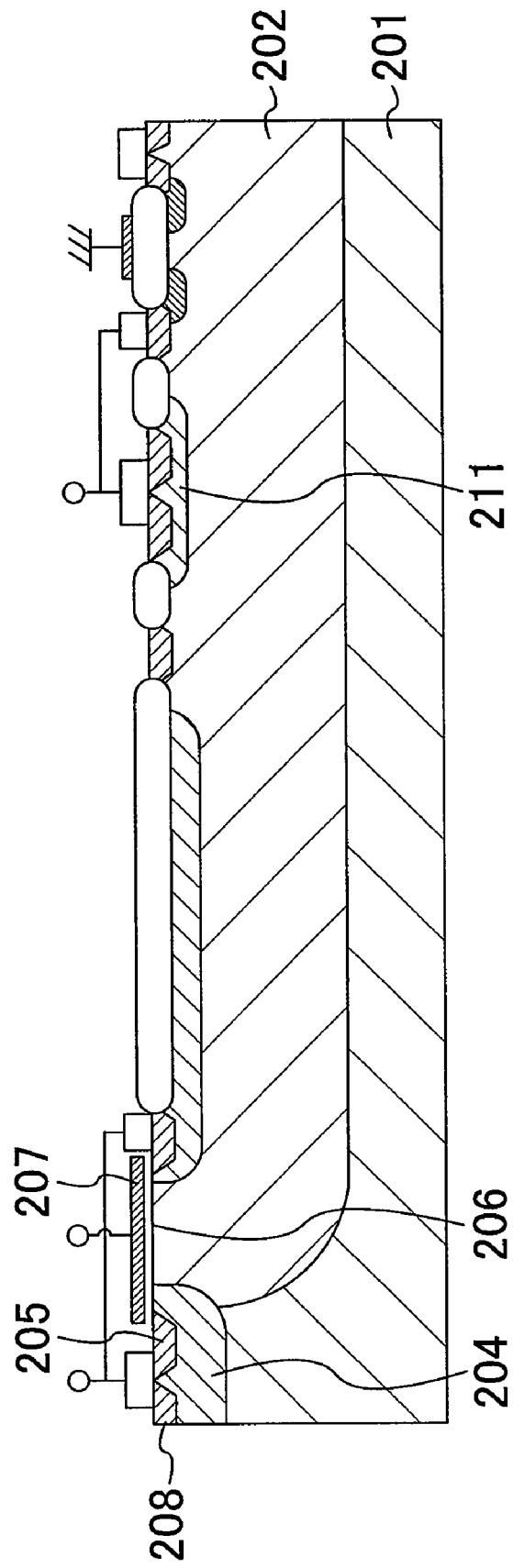
FIG. 17 is a cross sectional structure of a conventional semiconductor device.

FIG. 16 shows the current-voltage (I-V) characteristics of a semiconductor device of Embodiment 2. As in FIG. 16, a high-speed current rise is achieved by the MOS transistor operation when the voltage is around 2.2 V or lower, and high current is obtained by the IGBT operation when the voltage is around 2.2 V or higher.

As is the case with Embodiment 1, lattice defect is generated in the P-type Si semiconductor substrate 1 such that the resistance value of the semiconductor substrate 1 is twice to four times the resistance value of the semiconductor substrate 1 that depends on the P-type impurity concentration of the semiconductor substrate 1. This makes it possible to shorten the current fall time when the IGBT is turned off. In other words, a higher-speed switching with low on-resistance is possible by the high-speed current rise of the MOSFET operation and the shift from the MOSFET operation to the IGBT operation characterized by the high-speed current fall.

Also in Embodiment 2, the lifetime of carriers is shortened in the N-type RESURF region 2 and the P-type base region 3, if the lattice defect is generated not only in the semiconductor substrate 1 but also in the RESURF region 2 and the base region 3. As a result, the current fall speed at the time of turn-off is further increased.

As explained in the above, the semiconductor device and the semiconductor device fabrication method of the present invention achieve a semiconductor device of low on-resistance and high breakdown voltage that is capable of high-speed switching because of a semiconductor substrate having sufficient strength, and are suitable especially for a power semiconductor device or the like, such as a lateral IGBT.

What is claimed is:

1. A semiconductor device comprising:
    a semiconductor substrate of a first conductivity type;
    a RESURF region of a second conductivity type formed in an upper portion of the semiconductor substrate;
    a base region of the first conductivity type formed in an upper portion of the semiconductor substrate so as to be adjacent to the RESURF region;
    an emitter/source region of the second conductivity type formed in the base region so as to be apart from the RESURF region;
    a base connection region of the first conductivity type formed in the base region so as to be adjacent to the emitter/source region;
    a gate insulating film overlying the emitter/source region, the base region, and the RESURF region;
    a gate electrode formed on the gate insulating film;
    a collector region of the first conductivity type formed in the RESURF region so as to be apart from the base region; and
    an emitter/source electrode formed on the semiconductor substrate and electrically connected to the base connection region and the emitter/source region,
    wherein the semiconductor substrate has lattice defect such that a resistance value of the semiconductor substrate is twice or more a resistance value of the semiconductor substrate that depends on a concentration of an impurity implanted in the semiconductor substrate.

2. The semiconductor device of claim 1, further comprising:
    a drain region of the second conductivity type formed in the RESURF region so as to be apart from the base region; and
    a collector/drain electrode electrically connected to the collector region and the drain region.

3. The semiconductor device of claim 1, wherein the semiconductor substrate has a thickness of 200 μm or more.

4. The semiconductor device of claim 1, wherein the RESURF region and the base region have lattice defect in the same condition as the semiconductor substrate.

5. The semiconductor device of claim 1, wherein a thickness of the semiconductor substrate including the RBSURF region and the base region is 205 μm or more.

6. The semiconductor device of claim 1, wherein the collector region has an impurity concentration lower than that of the base connection region.

7. A method for fabricating a semiconductor device comprising the steps of:
    selectively forming a RESURF region of a second conductivity type in an upper portion of a semiconductor substrate of a first conductivity type;
    forming a base region of the first conductivity type in an upper portion of the semiconductor substrate so as to be adjacent to the RESURF region;
    sequentially depositing and selectively forming a gate insulating film and a gate electrode on part of the RESURF region and part of the base region such that the gate insulating film and the gate electrode extend over the part of the RESURF region and the part of the base region;
    forming an emitter/source region of the second conductivity type in an upper portion of the base region so as to be adjacent to the gate electrode;
    forming a base connection region of the first conductivity type in an upper portion of the base region so as to be adjacent to the emitter/source region;
    forming a collector region of the first conductivity type in the RESURF region so as to be apart from the base region;
    forming an emitter/source electrode on the semiconductor substrate so as to be electrically connected to the base connection region and the emitter/source region; and
    generating lattice defect in the semiconductor substrate by irradiating the semiconductor substrate with an electron beam such that a resistance value of the semiconductor substrate is twice or more a resistance value of the semiconductor substrate that depends on a concentration of an impurity implanted in the semiconductor substrate.

8. The method of claim 7, wherein the step of generating lattice defect includes irradiating a surface of the semiconductor substrate opposite to the RESURF region with the electron beam.

9. The method of claim 7, further comprising the step of forming in the RESURF region a drain region of the second conductivity type so as to be adjacent to the collector region.

10. A method for fabricating a semiconductor device comprising the steps of:
    selectively forming a RESURF region of a second conductivity type in an upper portion of a semiconductor substrate of a first conductivity type;
    forming a base region of the first conductivity type in an upper portion of the semiconductor substrate so as to be adjacent to the RESURF region;
    sequentially depositing and selectively forming a gate insulating film and a gate electrode on part of the RESURF region and part of the base region such that the gate insulating film and the gate electrode extend over the part of the RESURF region and the part of the base region;
    forming an emitter/source region of the second conductivity type in an upper portion of the base region so as to be adjacent to the gate electrode;
    forming a base connection region of the first conductivity type in an upper portion of the base region so as to be adjacent to the emitter/source region;
    forming a collector region of the first conductivity type in the RESURF region so as to be apart from the base region;
    forming an emitter/source electrode on the semiconductor substrate so as to be electrically connected to the base connection region and the emitter/source region; and
    generating lattice defect in the semiconductor substrate by irradiating the semiconductor substrate with protons such that a resistance value of the semiconductor substrate is twice or more a resistance value of the semiconductor substrate that depends on a concentration of an impurity implanted in the semiconductor substrate.

11. The method of claim 10, wherein the step of generating lattice defect includes irradiating a surface of the semiconductor substrate opposite to the RESURF region with the protons.

12. The method of claim 10, further comprising the step of forming in the RESURF region a drain region of the second conductivity type so as to be adjacent to the collector region.

* * * * *